(12) United States Patent
Kwak et al.

(10) Patent No.: US 10,056,871 B2
(45) Date of Patent: Aug. 21, 2018

(54) LOOP COMPENSATION USING DIFFERENTIAL DIFFERENCE AMPLIFIER FOR NEGATIVE FEEDBACK CIRCUITS

(71) Applicant: QUALCOMM Incorporated, San Diego, CA (US)

(72) Inventors: Taewoo Kwak, San Diego, CA (US); Joseph Rutkowski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/473,538

(22) Filed: Mar. 29, 2017

(65) Prior Publication Data

US 2018/0131336 A1 May 10, 2018

Related U.S. Application Data

(60) Provisional application No. 62/417,996, filed on Nov. 4, 2016.

(51) Int. Cl.
*H03F 1/34* (2006.01)
*H03F 3/45* (2006.01)
*H03F 1/02* (2006.01)

(52) U.S. Cl.
CPC ....... *H03F 3/45076* (2013.01); *H03F 1/0233* (2013.01); *H03F 3/45071* (2013.01);
(Continued)

(58) Field of Classification Search
CPC .......... H03F 1/34; H03F 3/45; H03F 3/45071; H03F 3/45183; H03F 3/45179;
(Continued)

(56) References Cited

U.S. PATENT DOCUMENTS 6,937,099 B2 * 8/2005 Kirby .................... H03F 1/3211
330/253
7,126,423 B1 * 10/2006 Kruiskamp ............... H03F 1/34
330/253
(Continued)

OTHER PUBLICATIONS

Cheng L., et al., "A 10/30MHz Wide-Duty-Cycle-Range Buck Converter with DDA-Based Type-III Compensator and Fast Reference-Tracking Responses for DVS Applications", IEEE International Solid-State Circuits Conference (ISSCC), Session 4, DC-DC Converters, 4.4, Feb. 10, 2014, pp. 1-3.
(Continued)

*Primary Examiner* — Khanh V Nguyen
(74) *Attorney, Agent, or Firm* — Qualcomm Incorporated/Seyfarth Shaw LLP

(57) ABSTRACT

A loop compensation circuit includes a differential difference amplifier having a first transconductance stage with a first input terminal and a second input terminal. The first input terminal is coupled to a voltage reference and the second input terminal is coupled to a feedback node. The amplifier also includes a second transconductance stage having a third input terminal and a fourth input terminal. The third input terminal is coupled to a virtually specified fixed voltage and the fourth input terminal is coupled to a fixed specified voltage. The loop compensation circuit also includes a feedback impedance coupled between an output of the differential difference amplifier and the third input terminal and a second impedance between the third input terminal and the fixed specified voltage.

21 Claims, 10 Drawing Sheets

(52) U.S. Cl.
CPC ............ *H03F 3/45183* (2013.01); *H03F 2203/45116* (2013.01); *H03F 2203/45526* (2013.01)

(58) Field of Classification Search
CPC ............ H03F 3/45188; H03F 3/45192; H03F 2200/177; H03F 3/45475; H03F 2200/261; H03F 2203/45
USPC .................................................. 330/253, 260
See application file for complete search history.

(56) References Cited

U.S. PATENT DOCUMENTS

| | | | | |
|---|---|---|---|---|
| 7,265,615 | B2 * | 9/2007 | Alexander | H03F 1/14 330/69 |
| 7,265,622 | B1 | 9/2007 | Koike | |
| 7,453,319 | B2 | 11/2008 | Gupta et al. | |
| 7,889,010 | B2 | 2/2011 | Wang | |
| 7,896,807 | B2 * | 3/2011 | Clancy | A61B 5/04 600/300 |
| 8,810,294 | B2 * | 8/2014 | Lynch | H03K 5/086 323/288 |
| 9,030,179 | B2 | 5/2015 | Zhu | |
| 2015/0236593 | A1 | 8/2015 | Cheng et al. | |

OTHER PUBLICATIONS

Fan J., et al., "A Low Power High Noise Immunity Boost DC-DC Converter Using the Differential Difference Amplifiers", Proceedings of the 2009 ACM/IEEE International Symposium on Low Power Electronics and Design, Aug. 19-21, 2009, San Francisco, CA, USA, ACM Press, New York, NY, Aug. 19, 2009, pp. 63-68, XP058210633, DOI: 10.1145/1594233.1594249 ISBN: 978-1-60558-684-7.

Huang S-C., et al., "Novel Full-integrated Active Filters Using the CMOS Differential Difference Amplifier", IEEE Proceedings of the 32nd Midwest Symposium on Circuits and Systems, Circuits and Systems, Aug. 14, 1989, pp. 173-176, XP010090150.

International Search Report and Written Opinion—PCT/US2017/055197—ISA/EPO—dated Jan. 4, 2018.

Yao K-W., et al., "A Differential Difference Amplifier for Neural Recording System With Tunable Low-Frequency Cutoff", IEEE International Conference on Devices and Solid-State Circuits, Piscataway, NJ, USA, Dec. 8, 2008, pp. 1-4, XP031411372, DOI: 10.1109/EDSSC.2008.4760720 ISBN: 978-1-4244-2539-6.

* cited by examiner

LOOP COMPENSATION USING DIFFERENTIAL DIFFERENCE AMPLIFIER FOR NEGATIVE FEEDBACK CIRCUITS

CROSS-REFERENCE TO RELATED APPLICATION

The present application claims the benefit of U.S. Provisional Patent Application No. 62/417,996, filed on Nov. 4, 2016, and titled "LOOP COMPENSATION USING DIFFERENTIAL FEEDBACK AMPLIFIER FOR NEGATIVE FEEDBACK CIRCUITS," the disclosure of which is expressly incorporated by reference herein in its entirety.

TECHNICAL FIELD

The present disclosure generally relates to loop compensation circuits including amplifiers. More specifically, the present disclosure relates to loop compensation using a differential difference amplifier for negative feedback circuits.

BACKGROUND

Electronic systems are becoming more and more complex, with an increasing number of power rails and supplies. To achieve optimum power solution density, reliability and cost, system designers might design their own power solutions, instead of using commercial power supply bricks. Designing and optimizing high performance switching mode power supplies is a challenging task.

Power supply loop compensation design is viewed as a difficult task, especially for inexperienced supply designers. Practical compensation design involves numerous iterations on the value adjustment of the compensation components. This is not only time consuming, but is also inaccurate in a complicated system whose supply bandwidth and stability margin can be affected by several factors.

SUMMARY

In an aspect of the present disclosure, a loop compensation circuit is presented. The loop compensation circuit includes a differential difference amplifier having a first transconductance stage with a first input terminal and a second input terminal. The first input terminal is coupled to a voltage reference and the second input terminal is coupled to a feedback node. The differential difference amplifier also includes a second transconductance stage having a third input terminal and a fourth input terminal. The third input terminal is coupled to a virtually specified fixed voltage and the fourth input terminal is coupled to a fixed specified voltage. The loop compensation circuit also includes a feedback impedance coupled between an output of the differential difference amplifier and the third input terminal. The loop compensation circuit further includes a second impedance between the third input terminal and the fixed specified voltage.

In another aspect of the present disclosure, loop compensation method is presented. The method includes controlling an output voltage based on a ratio of a first transconductance of a first transconductance stage of a differential difference amplifier and a second transconductance of a second transconductance stage of the differential difference amplifier. The first transconductance stage includes a first pair of inputs and the second transconductance stage includes a second pair of inputs. The method also includes feeding back the output voltage to a first input of the second pair of inputs corresponding to the second transconductance stage via a virtually specified fixed voltage terminal.

In yet another aspect of the present disclosure, a loop compensation circuit is presented. The loop compensation circuit includes a differential difference amplifier having a first transconductance stage with a first input terminal and a second input terminal. The first input terminal is coupled to a voltage reference and the second input terminal is coupled to a feedback node. The differential difference amplifier also includes a second transconductance stage having a third input terminal and a fourth input terminal. The third input terminal is coupled to a virtually specified fixed voltage and the fourth input terminal is coupled to a fixed specified voltage. The loop compensation circuit also includes means for generating impedance. The impedance generating means is coupled between an output of the differential difference amplifier and the third input terminal. The loop compensation circuit further includes a second impedance between the third input terminal and the fixed specified voltage.

In an aspect of the present disclosure, a power amplifier bias circuit with embedded envelope detection includes an envelope detector circuit to generate a baseband envelope tracking bias signal to bias a power amplifier. The envelope detector circuit includes a first source/emitter follower transistor, a current source, and a filter. The current source is coupled to an output node of the first source/emitter follower transistor. The filter is coupled to the output node of the first source/emitter follower transistor. The power amplifier bias circuit with embedded envelope detection further includes a power amplifier bias circuit stage coupled to the envelope detector circuit. The power amplifier bias circuit stage includes one or more replica transistors of the power amplifier, an envelope detector replica transistor, and a replica of the current source of the envelope detector circuit.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
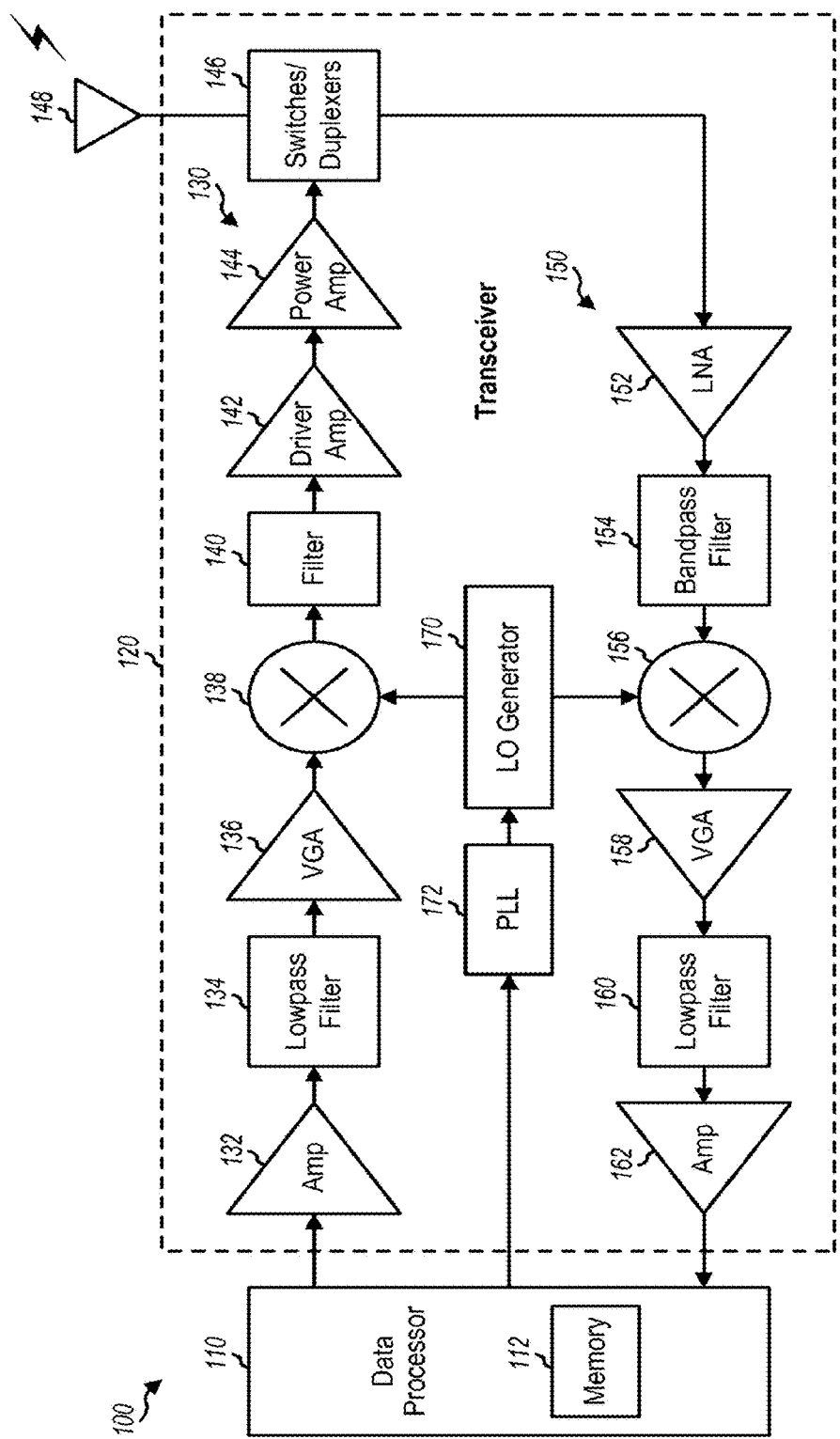
FIG. 1 shows a block diagram of a wireless communication device.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Aspects of the present disclosure are directed to power management integrated circuits (PMICs). More specifically, the present disclosure relates to loop compensation of a negative feedback loop.

Loop bandwidth should be limited to achieve stable operation in negative feedback circuits. Narrow loop bandwidth for a negative feedback circuit is difficult to implement in integrated circuits (ICs) because of area increase, accuracy degradation, etc., associated with low frequency loop compensation. For example, loop bandwidth of boost converters is limited by right half plane (RHP) zero, which moves down to low frequency as an inductor current increases.

In liquid crystal displays (LCDs) backlight driving boost converters or active matrix organic light emitting diodes (AMOLEDs) boost converters, the inductor current increases as the output voltage or the output current specification increases. These applications sometimes specify a low frequency compensation value (e.g., compensation zero frequency of a few kilo hertz (kHz)) with small mid-band gain. One way to achieve the low frequency compensation value with the small mid-band gain and to reduce the bandwidth without significantly affecting an area of a loop compensation circuit is by reducing an input transconductance (gm) of an amplifier. However, a small transconductance can cause poor direct current (DC) accuracy due to larger offset and smaller loop gain. Another way to achieve the low frequency compensation value with the small mid-band gain is by increasing passive components (capacitor (C), resistor (R)) to achieve low frequency poles and zeroes, which consumes more area.

Various exemplary designs of loop compensation implementations having improved performance are described.

Aspects of the present disclosure may increase (and possibly achieve) stability of a power control device (e.g., the PMICs, feedback amplifier circuits) through loop compensation using a differential difference amplifier (DDA). The differential difference amplifier includes a first (primary) transconductance stage and a second (secondary) transconductance stage. The differential difference amplifier may include a wide input common-mode range for the first and second transconductance stages. For example, the first and the second transconductance stages may accommodate different input common-mode voltages, whereas, conventional loop compensation circuits using a conventional differential amplifier have narrow input common-mode range. Further, aspects of the present disclosure utilize metal oxide semiconductor capacitors (MOSCAPs) which occupy a smaller area than metal-insulator-metal capacitors (MIM-CAPs).

The first transconductance stage includes input terminals (e.g., a first input stage) associated with a voltage reference and a feedback voltage. The second transconductance stage includes terminals associated with a virtually specified fixed voltage (e.g., virtual ground) and a fixed specified voltage (e.g., ground). The differential difference amplifier includes impedance in a feedback path from an output of the differential difference amplifier to a second input stage of the second transconductance stage.

The aspects of the present disclosure improve loop compensation regardless of input common-mode voltage and maintain high DC gain for high accuracy as well as achieve narrow bandwidth without a significant area increase.

The loop compensation circuit may be used in various electronic devices such as wireless communication devices, cellular phones, personal digital assistants (PDAs), handheld devices, wireless modems, laptop computers, cordless phones, Bluetooth devices, consumer electronic devices, etc. For example, the loop compensation circuit according to aspects of the present disclosure may be implemented in a wireless communication device of FIG. 1.

FIG. 1 shows a block diagram of an exemplary design of a wireless communication device 100. In this exemplary design, the wireless device 100 includes a data processor 110 and a transceiver 120. The transceiver 120 includes a transmitter 130 and a receiver 150 that support bi-directional wireless communication. In general, the wireless device 100 may include any number of transmitters and any number of receivers for any number of communication systems and any number of frequency bands.

In the transmit path, the data processor 110 processes data to be transmitted and provides an analog output signal to the transmitter 130. Within the transmitter 130, the analog output signal is amplified by an amplifier (Amp) 132, filtered by a low pass filter 134 to remove images caused by digital-to-analog conversion, amplified by a variable gain amplifier (VGA) 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, the antenna 148 receives signals from base stations and/or other transmitter stations and provides a received signal, which is routed through the switches/duplexers 146 and provided to the receiver 150. Within the receiver 150, the received signal is amplified by a low noise amplifier (LNA) 152, filtered by a bandpass filter 154, and downconverted from radio frequency to baseband by a mixer 156. The downconverted signal is amplified by a VGA 158, filtered by a low pass filter 160, and amplified by an amplifier 162 to obtain an analog input signal, which is provided to the data processor 110.

FIG. 1 shows the transmitter 130 and the receiver 150 implementing a direct-conversion architecture, which frequency converts a signal between radio frequency and baseband in one stage. The transmitter 130 and/or the receiver 150 may also implement a super-heterodyne architecture, which frequency converts a signal between radio frequency and baseband in multiple stages. A local oscillator (LO) generator 170 generates and provides transmit and receive LO signals to the mixers 138 and 156, respectively. A phase locked loop (PLL) 172 receives control information from the data processor 110 and provides control signals to the LO generator 170 to generate the transmit and receive LO signals at the proper frequencies.

FIG. 1 also shows an exemplary transceiver design. In general, the conditioning of the signals in the transmitter 130 and the receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and the receiver. For example, matching circuits may be used to match various active circuits in FIG. 1. Some circuits in FIG. 1 may also be omitted. The transceiver 120 may be implemented on one or more analog integrated circuits (ICs), radio frequency ICs (RFICs), mixed-signal ICs, etc. For example, the amplifier 132 through the power amplifier 144 in the transmitter 130 may be implemented on an RFIC. The driver amplifier 142 and the power amplifier 144 may also be implemented on another IC external to the RFIC.

The data processor 110 may perform various functions for the wireless device 100, e.g., processing for transmitted and received data. A memory 112 may store program codes and data for the data processor 110. The data processor 110 may be implemented on one or more application specific integrated circuits (ASICs) and/or other ICs.

As shown in FIG. 1, a transmitter and a receiver may include various amplifiers. Each amplifier at radio frequency may have input impedance matching and output impedance matching, which are not shown in FIG. 1 for simplicity.

Figure 2:
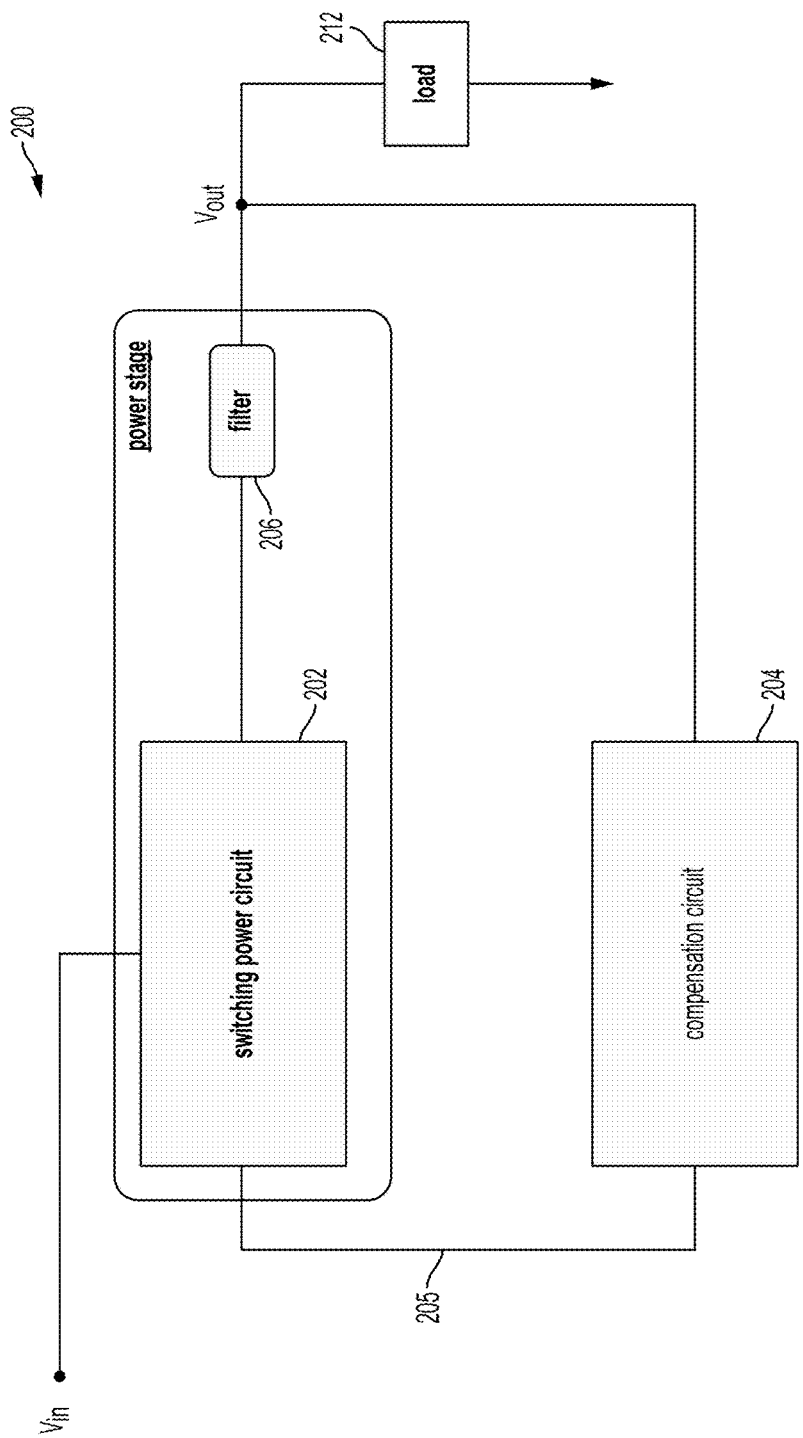
FIG. 2 is a high level block diagram of a switching regulator circuit including a loop compensation circuit.

FIG. 2 is a high level block diagram of a switching regulator circuit 200 including a loop compensation circuit. A switching regulator circuit 200 may receive an input voltage Vin and produce an output voltage Vout. The output voltage Vout may be used to drive a load 212. In accordance with aspects of the present disclosure, the switching regulator circuit 200 may include a switching power circuit 202 that receives the input voltage Vin. The switching power circuit 202 may output a switching signal that is supplied, via a filter 206, to the load 212 as the output voltage Vout. The switching power circuit 202 and filter 206 may be collectively referred to as the "power stage."

A compensation circuit 204 may compensate for variations in the output voltage Vout that may result from variations in the load 212, temperature fluctuation, and so on. In some aspects, for example, the compensation circuit 204 may provide a feedback control signal 205 that feeds into the switching power circuit 202 to control the duty cycle of the switching signal SW, thereby regulating the output voltage Vout.

In some aspects, the switching regulator circuit 200 is a buck regulator, where the output voltage Vout is less than the input voltage Vin. In accordance with aspects of the present disclosure, the compensation circuit 204 can ensure stable circuit operation for each of the different operating voltages.

Figure 3:
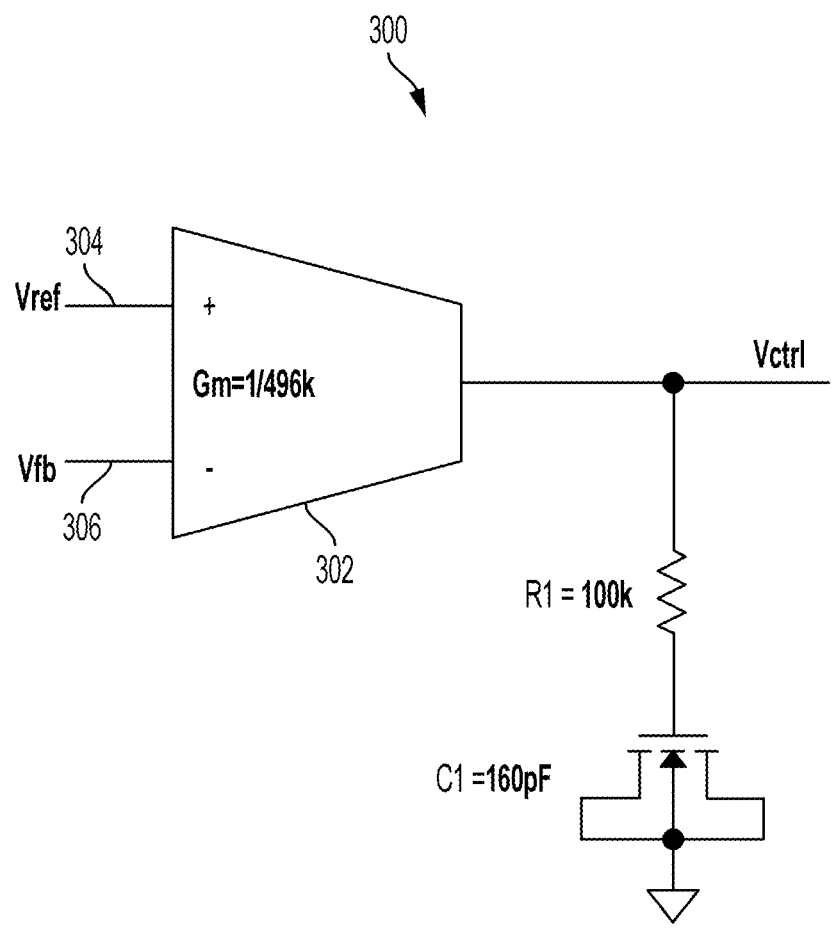
FIG. 3 illustrates a block diagram of a transconductance-capacitor loop compensator.

FIG. 3 illustrates a block diagram of a transconductance-capacitor loop compensator 300. The transconductance-capacitor loop (Gm-C) compensator includes a transconductance amplifier 302 that includes differential inputs 304 and 306. A feedback voltage Vfb from a power stage may be coupled or connected to an inverting input 306. A reference voltage Vref may be coupled or connected to a non-inverting input 304. The reference voltage Vref may be provided by an on-chip source or an off-chip source. An output Vctrl of the transconductance amplifier 302 may be coupled to an RC filter. The RC filter may include a resistor R1 (e.g., 100 KΩ) and a capacitor C1 (e.g., 160 Pf) coupled to an actual ground. The output Vctrl of the transconductance amplifier 302 may serve to generate duty cycle information of the power stage. A transconductance value ($g_m$) of the transconductance amplifier 302 may be programmable to achieve a desirable bandwidth.

In some implementations, the transconductance-capacitor loop compensator 300 uses a metal oxide semiconductor capacitor (MOSCAP) because it occupies a small area. For example, the capacitor C1 may be a MOSCAP. The MOSCAP includes a semiconductor (e.g., substrate) and a node (e.g., a gate) separated by an oxide layer. The MOSCAP may be used as a grounded capacitor. The capacitance of the MOSCAP is subject to variation based on a threshold voltage. The threshold voltage varies depending on the device used (e.g., MOSCAP or the amplifier). For example, a threshold voltage of 400 mV may be used for low voltage devices. However, to keep capacitance as constant as possible (e.g., independent of bias voltage conditions), a native n-type metal oxide semiconductor (NMOS) is used for the MOSCAP. The native NMOS may be vulnerable to substrate noise coupling.

The transconductance-capacitor loop compensator 300, however, is subject to poor DC accuracy when the transconductance value ($g_m$) is reduced to achieve a narrow or low bandwidth for certain applications. The poor DC accuracy may be caused by large direct current offset and a small loop gain when the transconductance is reduced. Further, the capacitance of the MOSCAP C1 is increased to narrow the bandwidth. Moreover, the transconductance-capacitor loop compensator 300 is commonly used for loop compensation in current-mode switching regulators, which may not need complicated loop compensation.

Figure 4:
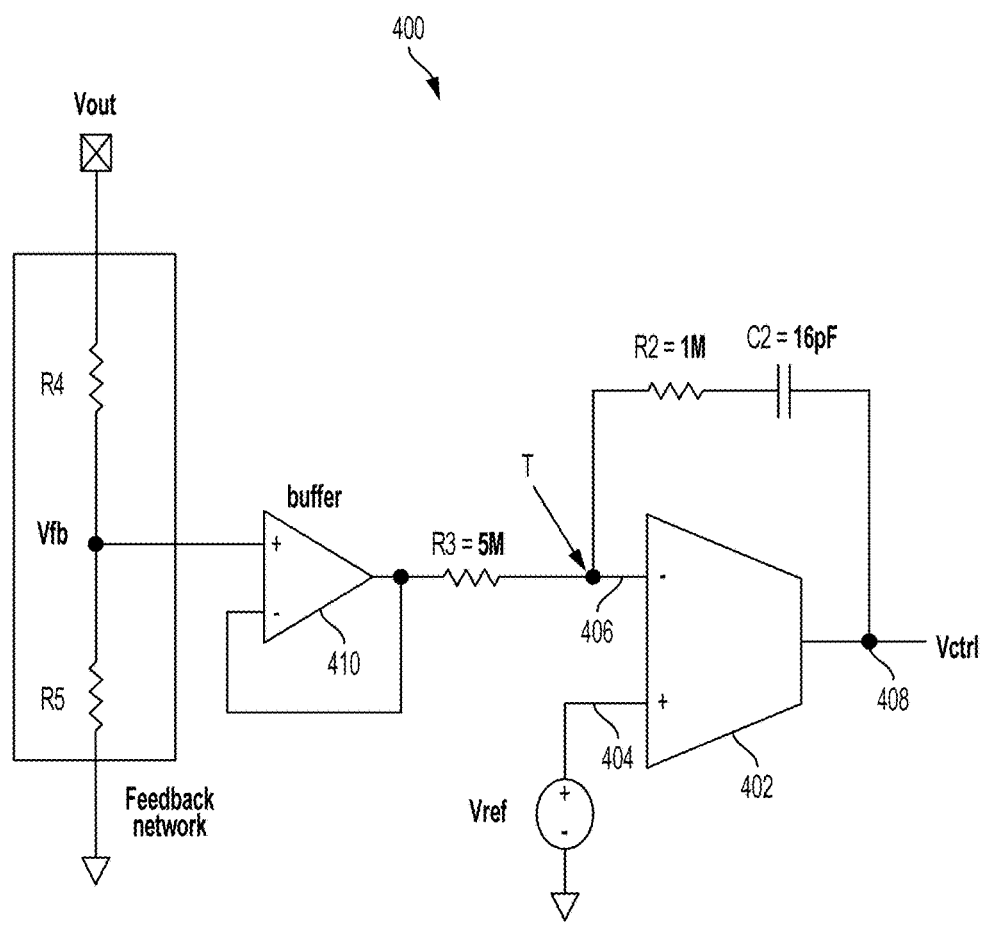
FIG. 4 illustrates a block diagram of a Miller Integrator Type compensation circuit.

FIG. 4 illustrates a block diagram of a Miller Integrator Type compensation circuit 400. The compensation circuit 400 is widely used for various types of loop compensation. The compensation circuit 400 includes a transconductance amplifier 402, a resistor R2 (e.g., 1 MΩ resistor) and a capacitor C2 (e.g., 16 pF capacitor). An inverse input 406 of the transconductance amplifier 402 is coupled to a feedback voltage Vfb via a buffer 410 (e.g., a unity gain buffer) and a resistor R3 (e.g., 5 MΩ resistor). A feedback network receives an output voltage Vout (e.g., from a voltage regulator). The feedback network includes a resistor divider, which includes resistors R4 and R5. The buffer 410 is usually specified if output voltage programming is made in the feedback network. The buffer, however, introduces additional offset error.

A non-inverse input 404 of the transconductance amplifier 402 is coupled to a reference voltage Vref. The transconductance amplifier 402 outputs an error voltage Ve or control voltage Vctrl via an output 408. The resistor R2 is connected to the capacitor C2 according to a series configuration. One terminal of the capacitor C2 is coupled to the output 408 of the transconductance amplifier 402, and one terminal of the resistor R2 is coupled to the inverse input 406 of the transconductance amplifier 402.

In many cases, the Miller Integrator Type compensation circuit 400 is desired to form a zero with lower frequency, so the capacitor C2 with larger capacitance and the resistor R2 with larger resistance are specified. For example, a 1 MΩ resistor and a 15 pF capacitor are specified to form a compensation zero in some boost power converters. As a result, a chip area for the Miller Integrator Type compensation circuit 400 is greatly increased for obtaining the larger capacitance. Additionally, the compensation effect is not satisfactory if a capacitor with lower capacitance is used. Further, the large area of the Miller Integrator Type compensation circuit 400 may be due to use of a metal-insulator-metal capacitor (MIMCAP). For example, the MIMCAP is used as the capacitor C2 because the terminal T is not a virtual or actual ground, which is specified for MOSCAPs. A large resistor, R2, may introduce significant parasitic capacitance, which causes an additional pole near the loop unity gain frequency. Thus, the Miller Integrator Type compensation circuit 400 is commonly used for loop compensation in voltage-mode switching regulators by inserting additional poles and zeroes for type-II or III compensators.

Figure 5:
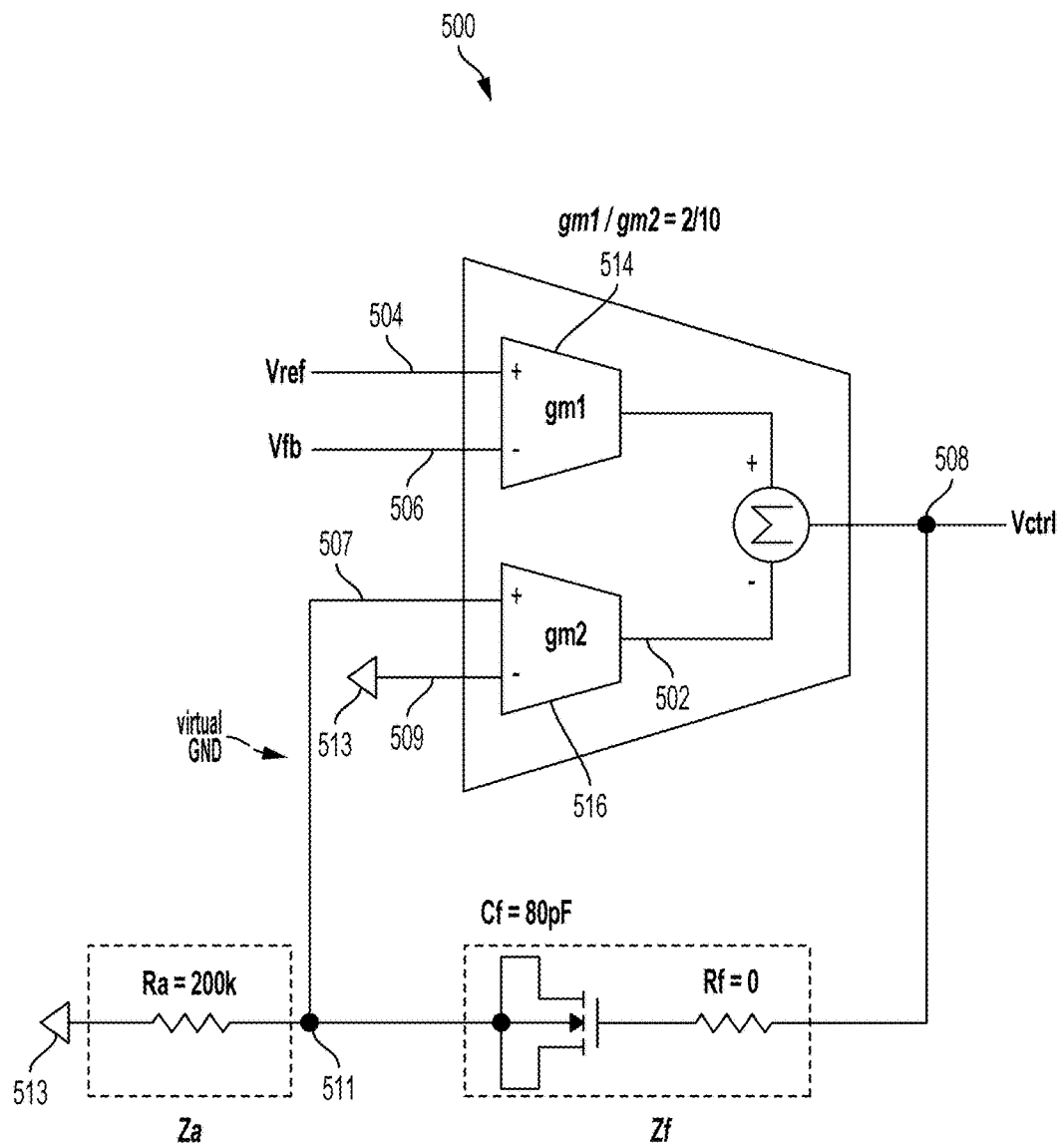
FIG. 5 illustrates a block diagram of a non-inverting Type I loop compensation circuit using a differential difference amplifier according to aspects of the present disclosure.

FIG. 5 illustrates a block diagram of an exemplary non-inverting loop compensation circuit 500 (e.g., Type I) using a differential difference amplifier according to aspects of the present disclosure. The loop compensation circuit 500 includes a differential difference amplifier 502, a first impedance Za, and a second impedance Zf. The first impedance Za and the second impedance Zf are coupled to the differential difference amplifier 502. The differential difference amplifier 502 includes a first (primary) transconductance stage 514 and a second (secondary) transconductance stage 516.

The first transconductance stage 514 includes a first input terminal 504 and a second input terminal 506. The first input terminal 504 is coupled to a voltage reference (Vref) and the second input terminal 506 is coupled to a feedback voltage Vfb. The second transconductance stage 516 includes a third input terminal 507 and a fourth input terminal 509. The third input terminal 507 is coupled to a virtually specified fixed voltage (e.g., virtual ground) 511 and the fourth input terminal 509 is coupled to a fixed specified voltage (e.g., ground) 513. The second impedance Zf (e.g., feedback impedance) includes a resistor Rf and feedback capacitor Cf (e.g., 80 pF). In some aspects, the resistance of the resistor Rf is substantially zero. A ratio (gm1/gm2) of the absolute transconductance values of the transconductance stages 514 and 516 may adjust a closed loop gain from Vref to Vctrl. Adjusting the transconductance ratio instead of each absolute transconductance value provides the flexibility of loop bandwidth adjustment without increasing capacitance, Cf Keeping the absolute transconductance value high for each input stage preserves the high DC gain, which maintains high DC accuracy.

Some aspects of the present disclosure use a MOSCAP for the feedback capacitor Cf A virtual ground for the MOSCAP is achieved by shifting input common mode voltage down to ground in the feedback path (virtual ground) while keeping Vref and Vfb in a specified programmable range. In one aspect, a terminal, a bottom terminal that is not a gate terminal) of the MOSCAP (used for capacitance Cf) is specified as low voltage (e.g., grounded) to provide a wide swing range of the output voltage (Vctrl). If a voltage difference across the MOSCAP is smaller than a threshold voltage, an effective capacitance of the MOSCAP decreases based on the bias condition. To avoid the decrease based on the bias condition, the bottom terminal voltage is reduced (e.g., as low as possible) and low voltage output of the differential difference amplifier is limited to allow output voltages, Vctrl, that are higher than the threshold voltage. As such, aspects of the present disclosure provide flexibility of input programmability (Vref) by making the secondary input virtually grounded regardless of the primary input bias condition. Conventional Miller type compensators cannot use MOSCAPs because of their input voltage range (which cannot be grounded or be a low voltage).

In other aspects, a MIMCAP may be used in series with the resistor Rf. The MIMCAP, however, occupies a large area and its capacitance does not depend on input/output voltage. The second impedance Zf is coupled between an output 508 of the differential difference amplifier 502 and the third input terminal 507 or the virtual ground 511. The output 508 of the differential difference amplifier 502 may be a control voltage Vctrl (e.g., feedback control signal 205). The first impedance Za (e.g., resistor Ra=200 kΩ) is coupled between the virtual ground 511 and the fixed specified voltage 513.

Figure 6:
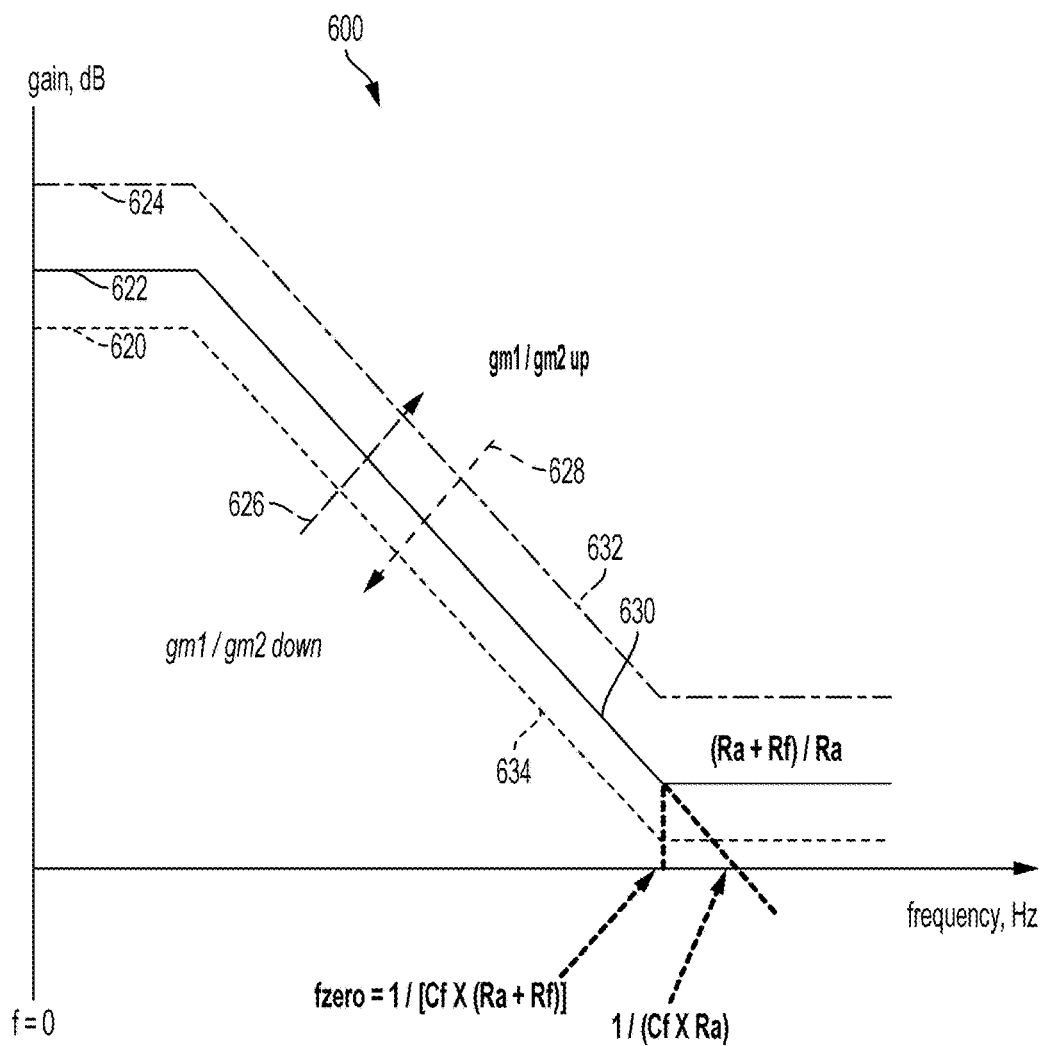
FIG. 6 illustrates a gain or magnitude plot based on a transfer function of the non-inverting loop compensation circuit of FIG. 5.

FIG. 6 illustrates a gain or magnitude plot 600 based on a transfer function of the non-inverting loop compensation circuit of FIG. 5. The x-axis of the gain plot 600 represents frequency while the y-axis represents gain (dB). The gain plot includes a first sub-gain plot 630, a second sub-gain plot 632 and a third sub-gain plot 634. Each of the sub-gain plots includes a zero corresponding to a frequency fzero that is based on the resistors Ra, Rf and the capacitor Cf.

The gain plot 600 is based on the following equation, which is based on the passive components and transconductance of the differential difference amplifier 502 of the non-inverting loop compensation circuit 500 of FIG. 5.

$$Vctrl/(Vref - Vfb) = [gm1 \times (Ra + Zf)]/[1 + gm2 \times Ra] \quad\quad 1$$

$$\approx (gm1/gm2) \times [(Ra + Zf)/Ra], \text{ if } (gm2 \times Ra) \gg 1.$$

where Zf is an impedance that is based on the MOSCAP Cf and a resistor Rf that is in series with the MOSCAP;
Za is an impedance based on a resistor Ra;
gm1 is a transconductance of a primary input stage;
gm2 is a transconductance of a secondary input stage;
Vref is a reference voltage;
Vfb is a feedback voltage; and
Vctrl is a control voltage that causes a duty cycle to vary in order to control a power transistor based on the duty cycle.

The impedances Za and Zf and their corresponding resistors and capacitors are used to determine the poles and zeros of the gain plot 600. The capacitor Cf and the resistor Rf in series are used to form a zero frequency (fzero). For example, fzero is given by the equation 1/[Cf*(Ra+Rf)]. The mid-band gain is given by (gm1/gm2)*(Ra+Rf)/Ra. For example, (Ra+Rf)/Ra is the mid-band gain when (gm1/gm2)=1.

A low frequency pole (e.g., at frequency=0) provides a high DC gain to reduce DC regulation error. Thus, the aspects of the present disclosure maintain a very high DC gain while keeping very low mid-band gain and low frequency zero. For example, each of the first sub-gain plot 630, the second sub-gain plot 632 and the third sub-gain plot 634 maintain a high DC gain, respectively, indicated by points 622, 624 and 620.

Maintaining the very high DC gain while keeping very low mid-band gain and low frequency zero by adjusting a ratio of the input transconductances (gm1/gm2) of the first transconductance stage 514 and the second transconductance stage 516 adjusts the gain of the amplifier. The adjustment of the ratio causes a movement up and down the gain plot 600 (as illustrated by the arrows 626 and 628). For example, increasing the ratio (gm1/gm2) causes the first sub-gain plot 630 to move to the second sub-gain plot 632, thereby increasing gain without changing the size of the passive components while maintaining substantially a same low frequency zero (e.g., fzero). Decreasing the ratio (gm1/gm2) causes the first sub-gain plot 630 to move to the third sub-gain plot 634 thereby decreasing gain without changing the size of the passive components while maintaining substantially a same low frequency zero (e.g., fzero). Thus, aspects of the present disclosure use relatively small capacitors and resistors by adjusting the gain plot with the ratio of the input transconductances (gm1/gm2).

Figure 7:
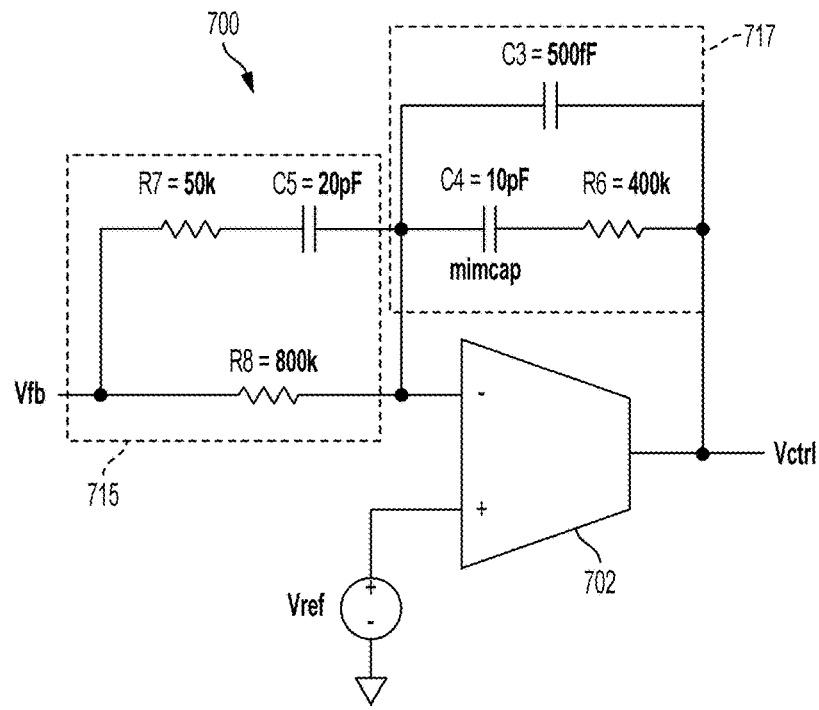
FIG. 7 illustrates a Type III compensator using a transconductance amplifier.

FIG. 7 illustrates a Type III compensator 700 using a transconductance amplifier 702. The Type III compensator 700 includes the transconductance amplifier 702, a first Type III compensator impedance 715 in series with the transconductance amplifier 702 and a second Type III compensator impedance 717 in parallel with the transconductance amplifier 702. The first Type III compensator impedance 715 includes resistors R7 (e.g., 50 kΩ) and R8 (e.g., 800 kΩ) and a capacitor C5 (e.g. 20 pF). The resistor R8 is in parallel with a series combination of the capacitor C5 and the resistor R7. The second Type III compensator impedance 717 includes resistor R6 (e.g., 400 kΩ) and capacitors C4 (e.g., 10 pF) and C3 (e.g. 500 fF). The capacitor C3 is in parallel with a series combination of the capacitor C4 and the resistor R6.

Figure 8:
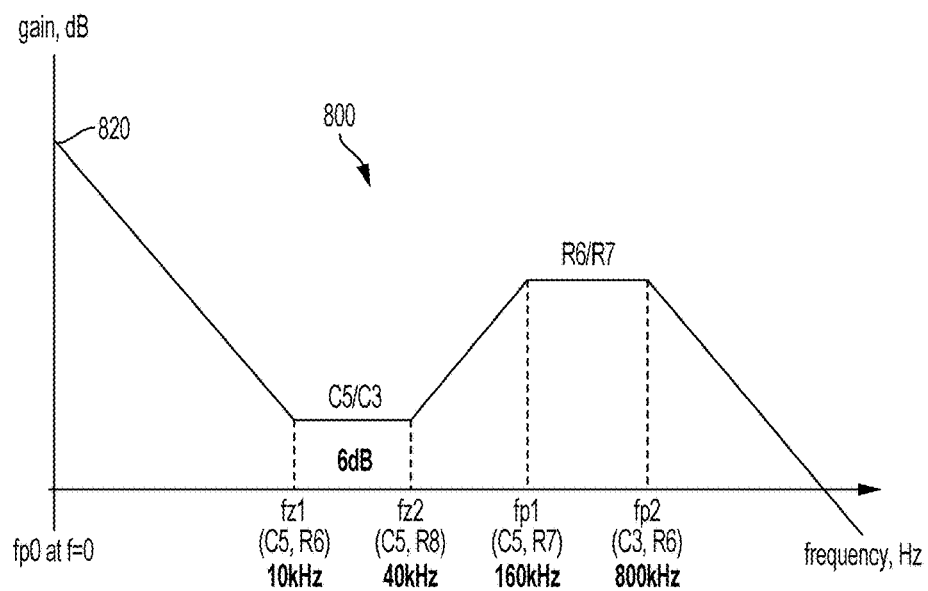
FIG. 8 illustrates a gain or magnitude plot based on a transfer function of the compensation circuit of FIG. 7.

FIG. 8 illustrates a gain plot 800 based on a transfer function of the compensation circuit of FIG. 7. The y-axis of the plot 800 represents gain, while the x-axis represents frequency. As shown in FIG. 8, the Type III compensator 700 has three poles and two zeros in a frequency domain. A low frequency pole fp0 (e.g., at frequency=0) provides a high DC gain at point 820 to reduce DC regulation error. The two zeros are fz1 (e.g., 10 kHz) and fz2 (e.g., 40 kHz). The gain of the transconductance amplifier 702 at the zeros is 6 dB and may be based on the capacitors C3 and C5. The two poles are fp1 (e.g., 160 kHz) and fp2 (e.g., 800 kHz). In this implementation, to achieve narrow bandwidth for stable operation of a voltage regulator/converter, for example, passive components (resistors and capacitors) sizes are increased to achieve low frequency poles and zeros. Thus, the Type III compensator 700 occupies an increased area. Aspects of the present disclosure achieve narrow bandwidth without the increased sizes of the passive components as illustrated in FIGS. 9 and 10.

Figure 9:
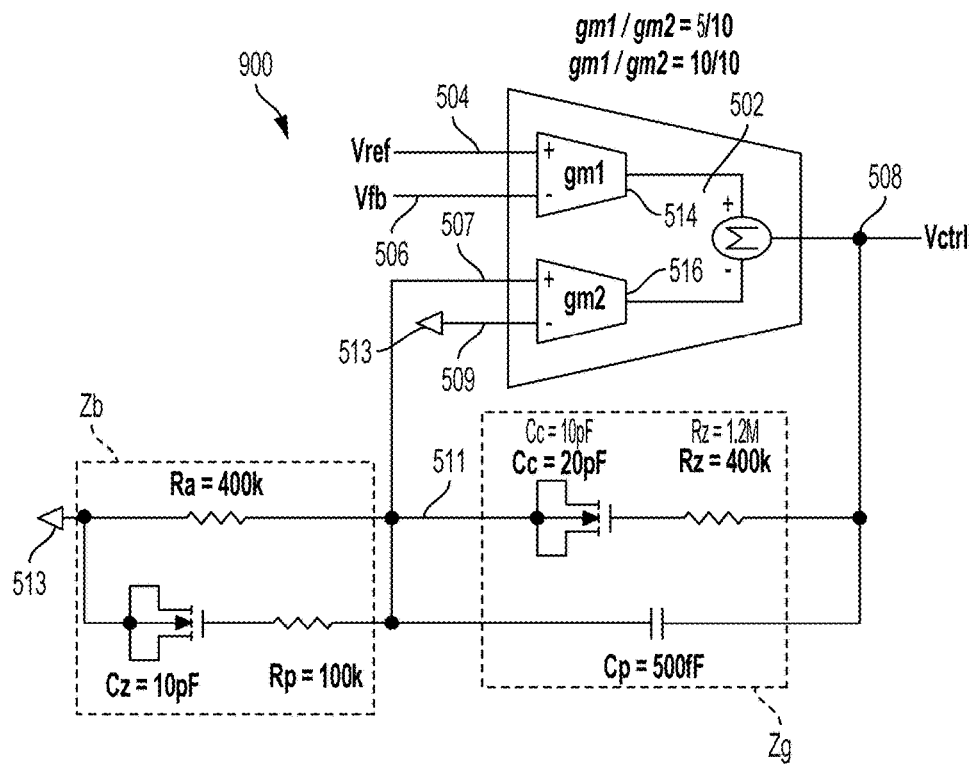
FIG. 9 illustrates a Type III compensation circuit using a differential difference amplifier according to aspects of the present disclosure.

FIG. 9 illustrates a compensation circuit 900 (e.g., Type III) using a differential difference amplifier 502 according to aspects of the present disclosure. The compensation circuit 900 illustrates a Type III compensator using the differential difference amplifier 502. For illustrative purposes, some of the labelling and numbering of the devices and features of FIG. 9 are similar to those of FIG. 5. For example, the compensation circuit 900 includes the differential difference amplifier 502, the first transconductance stage 514 and the second transconductance stage 516. The first transconductance stage 514 includes the first input terminal 504 and the second input terminal 506. The second transconductance stage 516 includes the third input terminal 507 and the fourth input terminal 509. The third input terminal 507 is coupled to the virtually specified fixed voltage (e.g., virtual ground) 511 and the fourth input terminal 509 is coupled to the fixed specified voltage (e.g., ground) 513. The differential difference amplifier 502 also includes the output 508.

The feedback portion of the loop compensation circuit 900 of FIG. 9, however, is different from the feedback portion of the loop compensation circuit 500. For example, the passive components of the feedback portion of the compensation circuit 900 are different from the passive components of the compensation circuit 500. The compensation circuit 900 includes a first feedback impedance Zg and a second feedback impedance Zb coupled to the output 508 of the differential difference amplifier 502. The first feedback impedance Zg includes a capacitor Cp (e.g., 500 Ff) in parallel with a series combination of a resistor Rz (e.g., 400 kΩ or 1.2 MΩ) and a capacitor Cc (e.g., 20 pF or 10 pF). The resistor Rz and the capacitor Cc may be adjustable. The capacitor Cc may be a MOSCAP or a MIMCAP. The second feedback impedance Zb is coupled to the first feedback impedance Zg through the virtual ground 511. The second feedback impedance Zb includes a resistor Rb (e.g., 400 kΩ) in parallel with a series combination of a resistor Rp (e.g., 100 kΩ) and a capacitor Cz (e.g., 10 pF). The capacitor Cz may be a MOSCAP or a MIMCAP.

Figure 10:
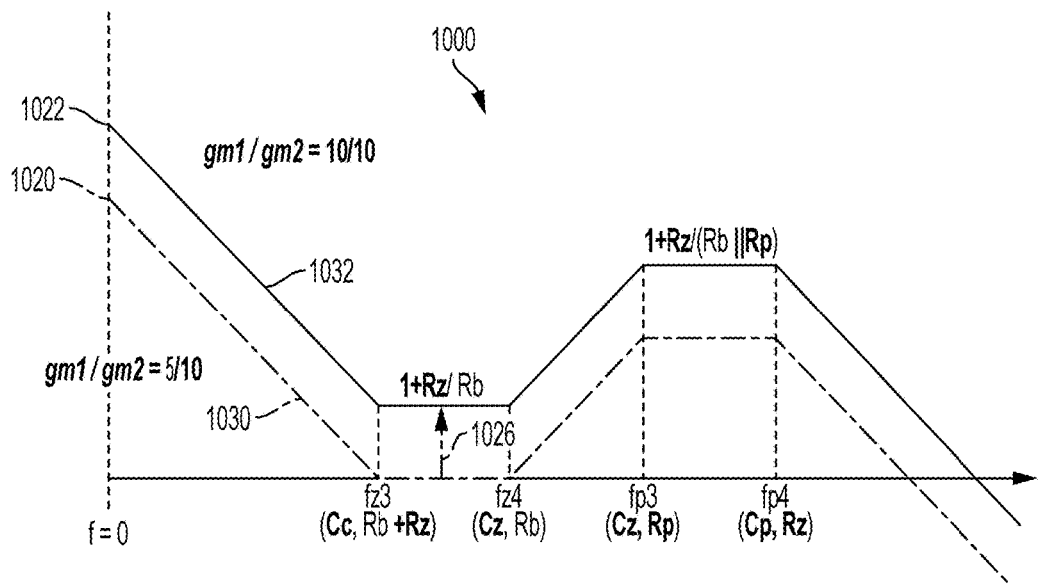
FIG. 10 illustrates a gain or magnitude plot based on a transfer function of the non-inverting loop compensation circuit of FIG. 9.

The impedance (Zb and Zg) configuration of FIG. 10 forms more pole and zero frequencies (e.g., three poles and two zeroes), for example, relative to the configuration of FIG. 5, which has only one pole and one zero. A MOSCAP is used in the configuration because the area used by the MOSCAP is significantly smaller than the MIMCAP area for the same capacitance. The implementation of adjusting the transconductance (gm) ratio also saves area by allowing for capacitance reduction.

FIG. 10 illustrates a gain or magnitude plot 1000 based on a transfer function of the non-inverting loop compensation circuit of FIG. 9. The x-axis of the gain plot 1000 represents frequency while the y-axis represents gain (dB). The gain plot includes a first sub-gain plot 1030, and a second sub-gain plot 1032. Similar to the Type III compensator 700, the Type III compensator using the differential difference amplifier 502 has three poles and two zeros in the frequency domain. A low frequency pole (e.g., at frequency=0) provides a high DC gain, respectively, at points 1020 and 1022 of the first sub-gain plot 1030, and the second sub-gain plot 1032. The two zeros are fz3 (e.g., based on passive components Cc, Rb and Rz) and fz4 (e.g., based on passive components Cz and Rb). The remaining two poles are fp3 (e.g., based on passive components Cz and Rp) and fp4 (e.g., based on passive components Cp and Rz).

A gain of the differential difference amplifier 502 at the zeros fz3 and fz4 may be based on the resistors Rz and Rb (e.g., gain=1+Rz/Rb). The gain of the differential difference amplifier 502 at the poles fp3 and fp4 may be based on the resistors Rz, Rp and Rb (e.g., gain=1+Rz/(Rb∥Rp)).

Similar to the illustration of FIG. 6 where the ratio (gm1/gm2) is adjusted to cause a movement in the gain plot 600, an adjustment of the ratio (gm1/gm2) causes a movement up and down the gain plot 1000, as illustrated by the arrow 1026 of FIG. 10. For example, increasing the ratio (gm1/gm2) from 5/10 to 10/10 causes the first sub-gain plot 1030 to move to the second sub-gain plot 1032 thereby increasing gain without changing the size of the passive components while maintaining low frequency zeros (e.g., fz3 and fz4).

Figure 11:
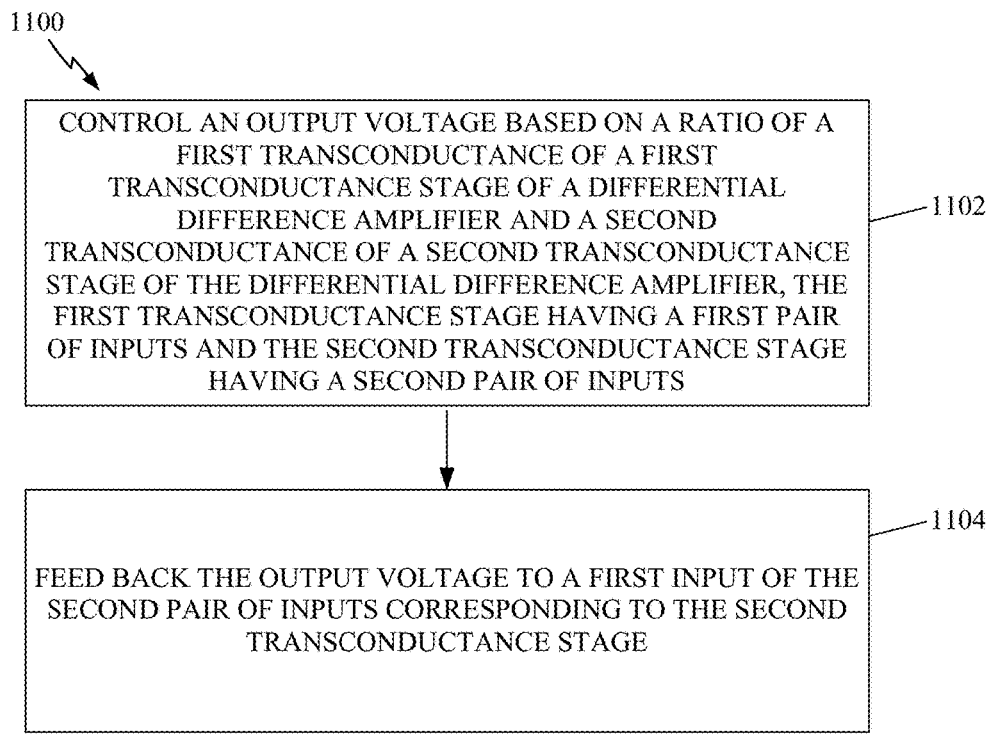
FIG. 11 is a process flow diagram illustrating a loop compensation method according to aspects of the present disclosure.

FIG. 11 is a process flow diagram 1100 illustrating a loop compensation method according to aspects of the present disclosure. In block 1102, a differential difference amplifier of a loop compensation circuit controls an output voltage based on a ratio of a first transconductance of a first transconductance stage of the differential difference amplifier and a second transconductance of a second transconductance stage of the differential difference amplifier. The first transconductance stage includes a first pair of inputs and the second transconductance stage includes a second pair of inputs. In block 1104, the loop compensation circuit feeds back the output voltage to a first input of the second pair of inputs corresponding to the second transconductance stage.

According to a further aspect of the present disclosure, a loop compensation circuit is described. The loop compensation circuit includes means for generating impedance, the impedance generating means coupled between an output of the differential difference amplifier and the third input terminal. The impedance generating means may be the MOSCAP Cf, the MIMCAP Cc, and/or the resistor Rf. In another aspect, the aforementioned means may be any module or any apparatus configured to perform the functions recited by the aforementioned means.

Figure 12:
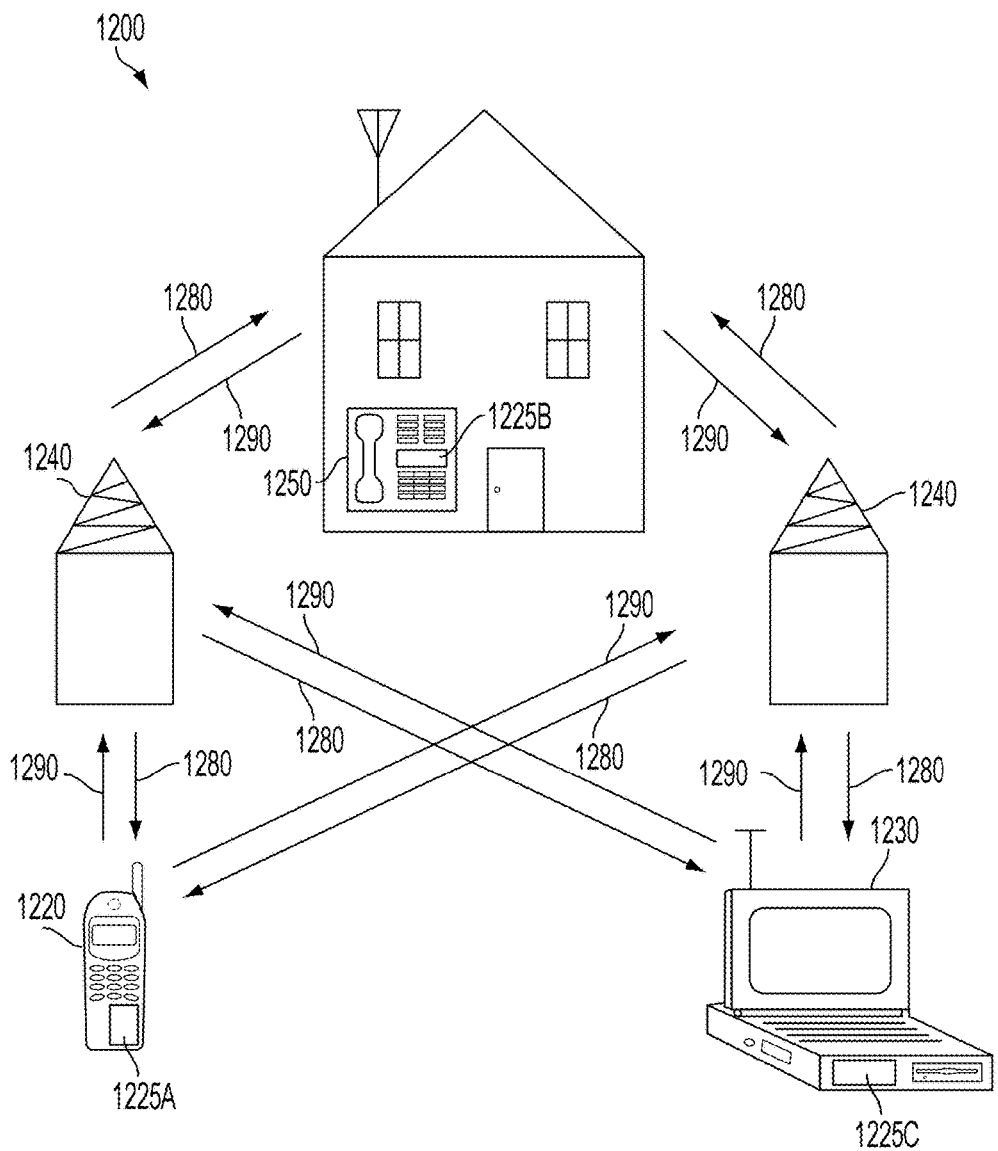
FIG. 12 is a block diagram showing an exemplary wireless communication system in which a configuration of the disclosure may be advantageously employed.

FIG. 12 is a block diagram showing an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed loop compensation circuit. It will be recognized that other devices may also include the disclosed loop compensation circuit, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed loop compensation circuit.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A loop compensation circuit, comprising:
   a differential difference amplifier, in a negative feedback loop, having:
      a first transconductance stage with a first input terminal and a second input terminal, the first input terminal coupled to a voltage reference and the second input terminal coupled to a feedback node configured to receive a feedback voltage from an output of a switching power circuit; and
      a second transconductance stage having a third input terminal and a fourth input terminal, the fourth input terminal coupled to a fixed specified voltage;

a feedback impedance coupled between an output of the differential difference amplifier and the third input terminal, the output of the differential difference amplifier comprising a control signal configured to control the switching power circuit, which is configured to receive an input voltage and generate an output voltage at the output of the switching power circuit to drive a load; and a second impedance between the third input terminal and the fixed specified voltage.

2. The loop compensation circuit of claim 1, in which the feedback impedance comprises a resistor in series with either a metal oxide semiconductor capacitor (MOSCAP) or a metal-insulator-metal capacitor (MIMCAP).

3. The loop compensation circuit of claim 1, in which the fixed specified voltage comprises a ground.

4. The loop compensation circuit of claim 1, in which the third input terminal is coupled to a virtually specified fixed voltage.

5. The loop compensation circuit of claim 4, in which the virtually specified fixed voltage comprises a virtual ground.

6. The loop compensation circuit of claim 5, in which the virtual ground for a metal oxide semiconductor capacitor (MOSCAP) comprises a common mode voltage of a feedback path of the loop compensation circuit shifted down to ground while the voltage reference and a feedback voltage at the feedback node are maintained in a specified programmable range.

7. The loop compensation circuit of claim 1, in which the first input terminal and the third input terminal are positive input terminals, and the second input terminal and the fourth input terminal are negative input terminals.

8. A loop compensation method, comprising:
controlling an output voltage of a differential difference amplifier based at least in part on a ratio of a first transconductance of a first transconductance stage of the differential difference amplifier and a second transconductance of a second transconductance stage of the differential difference amplifier, the first transconductance stage having a first pair of inputs and the second transconductance stage having a second pair of inputs, in which a second input of the second pair of inputs is coupled to a fixed specified voltage;

receiving, at a first input of the first pair of inputs, a feedback voltage from an output of a switching power circuit to control the output voltage of the difference amplifier in accordance with a negative feedback loop, the switching power circuit configured to receive an input voltage and to generate an output voltage at the output of the switching power circuit to drive a load; and feeding back the output voltage of the difference amplifier to a first input of the second pair of inputs corresponding to the second transconductance stage.

9. The loop compensation method of claim 8, further comprising feeding back the output voltage to the first input of the second pair of inputs via a resistor in series with either a metal oxide semiconductor capacitor (MOSCAP) or a metal-insulator-metal capacitor (MIMCAP).

10. The loop compensation method of claim 8, further comprising receiving a reference voltage at a second input of the first pair of inputs corresponding to the first transconductance stage of the differential difference amplifier.

11. The loop compensation method of claim 10, in which the output voltage is based at least in part on a difference between the reference voltage and the feedback voltage.

12. The loop compensation method of claim 10, further comprising shifting an input common-mode voltage down to ground in a feedback path of a loop compensation circuit including the differential difference amplifier while maintaining the reference voltage and the feedback voltage in a specified programmable range.

13. The loop compensation method of claim 8, further comprising receiving a fixed specified voltage at a second input of the second pair of inputs.

14. The loop compensation method of claim 8, further comprising adjusting a closed loop gain of the differential difference amplifier by adjusting the ratio.

15. The loop compensation method of claim 8, in which feeding back the output voltage comprises feeding back the voltage to the first input of the second pair of inputs corresponding to the second transconductance stage via a virtually specified fixed voltage terminal.

16. A loop compensation circuit, comprising:
a differential difference amplifier, in a negative feedback loop, having:
a first transconductance stage with a first input terminal and a second input terminal, the first input terminal coupled to a voltage reference and the second input terminal coupled to a feedback node configured to receive a feedback voltage from an output of a switching power circuit; and
a second transconductance stage having a third input terminal and a fourth input terminal, the fourth input terminal coupled to a fixed specified voltage;

means for generating impedance, the impedance generating means coupled between an output of the differential difference amplifier and the third input terminal, the output of the differential difference amplifier comprising a control signal configured to control the switching power circuit, which is configured to receive an input voltage and generate an output voltage at the output of the switching power circuit to drive a load; and a second impedance between the third input terminal and the fixed specified voltage.

17. The loop compensation circuit of claim 16, in which the fixed specified voltage comprises a ground.

18. The loop compensation circuit of claim 16, in which the third input terminal is coupled to a virtually specified fixed voltage.

19. The loop compensation circuit of claim 18, in which the impedance generating means is coupled to a terminal having the virtually specified fixed voltage.

20. The loop compensation circuit of claim 18, in which the virtually specified fixed voltage comprises a virtual ground.

21. The loop compensation circuit of claim 20, in which the virtual ground comprises a common mode voltage of a feedback path of the loop compensation circuit shifted down to ground while the voltage reference and a feedback voltage at the feedback node are maintained in a specified programmable range.

* * * * *